United States Patent
de Souza et al.

(10) Patent No.: US 9,916,984 B2
(45) Date of Patent: *Mar. 13, 2018

(54) SELF-ALIGNED SOURCE AND DRAIN REGIONS FOR SEMICONDUCTOR DEVICES

(71) Applicant: INTERNATIONAL BUSINESS MACHINES CORPORATION, Armonk, NY (US)

(72) Inventors: Joel P. de Souza, Putnam Valley, NY (US); Bahman Hekmatshoartabari, White Plains, NY (US); Jeehwan Kim, Los Angeles, CA (US); Siegfried L. Maurer, Stormville, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/483,273

(22) Filed: Apr. 10, 2017

(65) Prior Publication Data
US 2017/0213736 A1    Jul. 27, 2017

Related U.S. Application Data

(63) Continuation of application No. 15/223,988, filed on Jul. 29, 2016, which is a continuation of application
(Continued)

(51) Int. Cl.
*H01L 21/336* (2006.01)
*H01L 27/092* (2006.01)
(Continued)

(52) U.S. Cl.
CPC ........ *H01L 21/283* (2013.01); *H01L 21/3213* (2013.01); *H01L 21/32133* (2013.01);
(Continued)

(58) Field of Classification Search
CPC .............. H01L 21/283; H01L 21/3213; H01L 21/32133; H01L 29/6656; H01L 29/66446;
(Continued)

(56) References Cited

U.S. PATENT DOCUMENTS

5,773,333 A    6/1998  Jo
5,824,572 A    10/1998  Fukui et al.
(Continued)

FOREIGN PATENT DOCUMENTS

CN    102593008 A    7/2012
CN    103236440 A    8/2013
(Continued)

OTHER PUBLICATIONS

Fist of IBM Patents or Patent Applications Treated as Related dated Apr. 10, 2017.
(Continued)

*Primary Examiner* — Dao H Nguyen
(74) *Attorney, Agent, or Firm* — Tutunjian & Bitetto, P.C.; Louis J. Percello

(57) ABSTRACT

A method for forming a semiconductor device includes patterning a gate conductor, formed on a substrate, and a two-dimensional material formed on the gate conductor. Recesses are formed adjacent to the gate conductor in the substrate, and a doped layer is deposited in the recesses and over a top of the two-dimensional material. Tape is adhered to the doped layer on top of the two-dimensional material. The tape is removed to exfoliate the doped layer from the top of the two-dimensional material to form source and drain regions in the recesses.

20 Claims, 2 Drawing Sheets

Related U.S. Application Data

No. 14/656,371, filed on Mar. 12, 2015, now Pat. No. 9,443,957.

(51) Int. Cl.

| | |
|---|---|
| *H01L 29/78* | (2006.01) |
| *H01L 21/283* | (2006.01) |
| *H01L 21/3213* | (2006.01) |
| *H01L 29/08* | (2006.01) |
| *H01L 29/40* | (2006.01) |
| *H01L 29/66* | (2006.01) |
| *A23C 9/123* | (2006.01) |
| *A23C 11/08* | (2006.01) |
| *A23C 9/13* | (2006.01) |

(52) U.S. Cl.
CPC ........ *H01L 29/0847* (2013.01); *H01L 29/401* (2013.01); *H01L 29/6656* (2013.01); *H01L 29/66446* (2013.01); *H01L 29/66636* (2013.01); *H01L 29/78* (2013.01); *A23C 9/123* (2013.01); *A23C 9/1315* (2013.01); *A23C 11/08* (2013.01)

(58) Field of Classification Search
CPC ............. H01L 29/66636; H01L 29/401; H01L 29/42376; H01L 29/0847; H01L 29/78; A23C 11/08; A23C 9/123; A23C 9/1315; A23C 19/055
USPC ............ 257/288, 194, 344, 24, 77, E21.131, 257/E21.144, E21.296, E21.409, E29.082, 257/E29.255; 438/285, 283, 172, 303, 438/306, 495

See application file for complete search history.

(56) References Cited

U.S. PATENT DOCUMENTS

| | | | |
|---|---|---|---|
| 8,709,957 | B2 | 4/2014 | Bedell et al. |
| 9,443,957 | B1* | 9/2016 | de Souza .......... H01L 29/66636 |
| 2002/0003260 | A1 | 1/2002 | Murakami |
| 2004/0245549 | A1 | 9/2004 | Chang et al. |
| 2009/0184378 | A1* | 7/2009 | Zhu .................. H01L 21/28079 257/387 |
| 2012/0139054 | A1* | 6/2012 | Yin .................. H01L 21/28114 257/369 |
| 2012/0295427 | A1* | 11/2012 | Bauer ............... H01L 21/02532 438/494 |
| 2013/0244390 | A1 | 9/2013 | Zinn |
| 2016/0336424 | A1* | 11/2016 | de Souza .......... H01L 29/66636 |
| 2016/0359017 | A1* | 12/2016 | Park .................. H01L 29/66795 |

FOREIGN PATENT DOCUMENTS

| | | |
|---|---|---|
| CN | 103715255 A | 4/2014 |
| CN | 104022077 A | 9/2014 |
| JP | 60260158 A | 12/1985 |

OTHER PUBLICATIONS

Notice of Allowance dated Jun. 6, 2017, which was cited in a corresponding U.S. Appl. No. 15/224,035 (pp. 1-9).

* cited by examiner

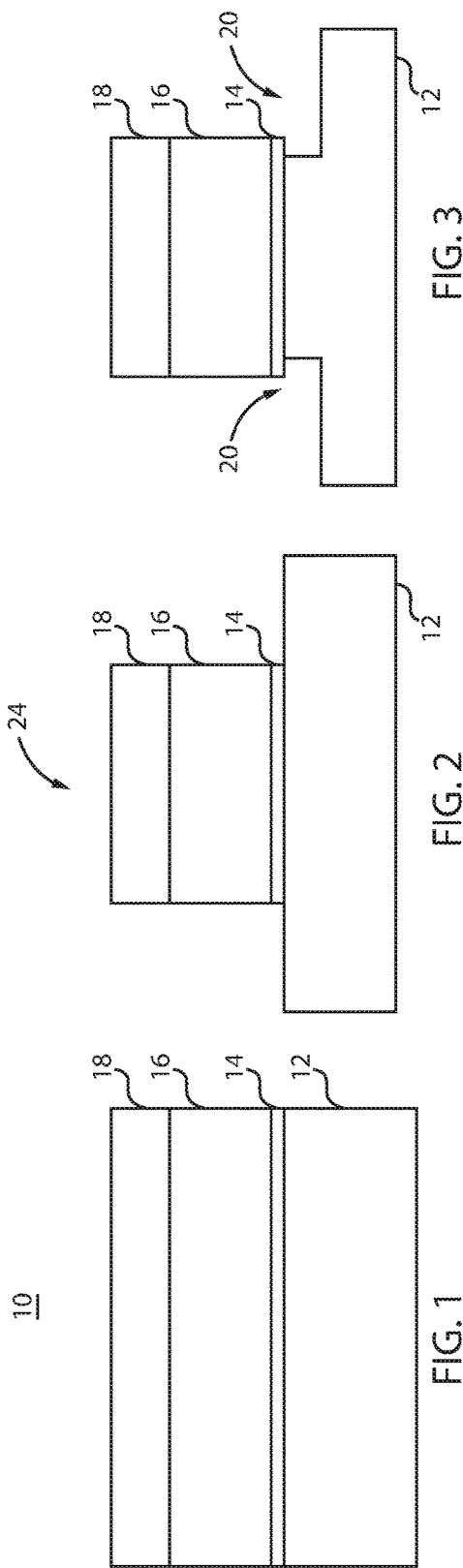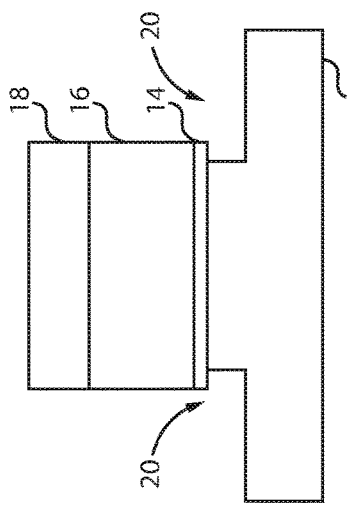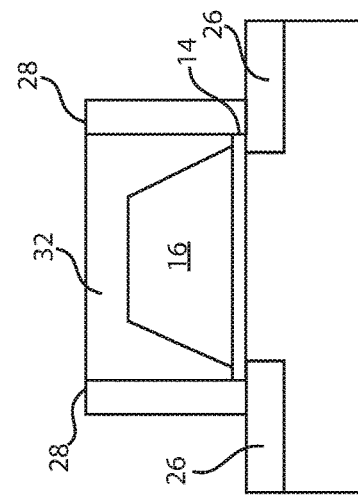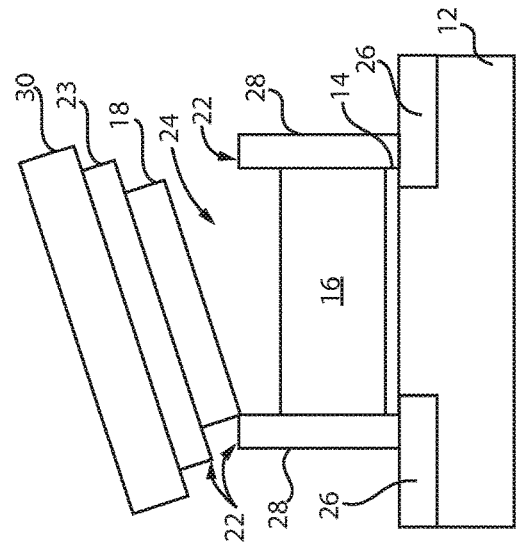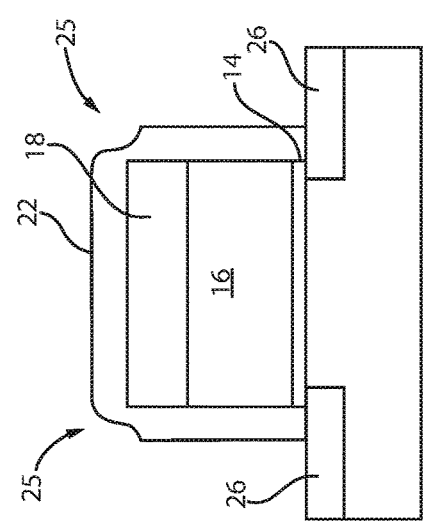

SELF-ALIGNED SOURCE AND DRAIN REGIONS FOR SEMICONDUCTOR DEVICES

BACKGROUND

Technical Field

The present invention relates to semiconductor devices and processes, and more particularly to semiconductor devices that employ deposition and exfoliation of layers to form source and drain regions for transistor devices.

Description of the Related Art

Field effect transistors (FETs) often include doped source and drain regions made of a similar material. In one common structure, III-V FETs include source/drain (S/D) regions formed from doped InGaAs (e.g., n+ InGaAs). The formation process for forming S/D regions usually requires patterned implantation of n+ dopants, which adds time and expense to the process, and may result in junction damage. To avoid ion-implantation, selective epitaxial growth processes may be employed.

The selective epitaxial growth processes for FET structures often form a gate structure (with dielectric sidewall spacers on sides of a gate conductor material) over a substrate, recess regions adjacent to the gate structure and perform a selective epitaxy process to form source and drain (S/D) regions within the recess regions. The S/D regions are doped using a doped layer that is deposited over the gate structure. Dopants from the doped layer are diffused into the S/D regions. Then, a chemical-mechanical polish (CMP) is performed to remove the doped layer from a top of the gate structure. This procedure avoids ion-implantation for doping but requires many additional steps. Selective epitaxial growth limits the process flow and may be expensive and time consuming. Extra CMP steps also add additional time delays and run the risk of damage or other issues to the already formed components on the device.

SUMMARY

A method for forming a semiconductor device includes patterning a gate conductor, formed on a substrate, and a two-dimensional material formed on the gate conductor. Recesses are formed adjacent to the gate conductor in the substrate, and a doped layer is deposited in the recesses and over a top of the two-dimensional material. Tape is adhered to the doped layer on top of the two-dimensional material. The tape is removed to exfoliate the doped layer from the top of the two-dimensional material to form source and drain regions in the recesses.

Another method for forming a semiconductor device includes depositing a gate conductor on a substrate; forming a two-dimensional material on the gate conductor; patterning the gate conductor and the two-dimensional material; etching self-aligned recesses adjacent to the gate conductor in the substrate; depositing a doped layer in the recesses, along sidewalls of the gate conductor and over a top of the two-dimensional material; adhering tape to the doped layer on top of the two-dimensional material; and removing the tape to exfoliate the doped layer from the top of the two-dimensional material to form source and drain regions in the recesses.

A semiconductor device includes a gate conductor formed on a substrate. A deposited doped layer is formed in recesses adjacent to the gate conductor and extends along sidewalls of the gate conductor to form vertical portions. The doped layer forms source and drain regions for the semiconductor device. The gate conductor is shaped between the vertical portions to permit formation of a dielectric material between the gate conductor and the vertical portions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 is a cross-sectional view of a partially fabricated field effect transistor with a gate conductor formed on a substrate and a two-dimensional material formed on the gate materials in accordance with the present principles;

FIG. 2 is a cross-sectional view of the partially fabricated field effect transistor of FIG. 1 with the gate conductor and the two-dimensional material patterned to form a gate structure in accordance with the present principles;

FIG. 3 is a cross-sectional view of the partially fabricated field effect transistor of FIG. 2 with the gate structure self-aligning an etching process to form recesses adjacent to the gate structure in accordance with the present principles;

FIG. 4 is a cross-sectional view of the partially fabricated field effect transistor of FIG. 3 with a doped layer deposited over the gate structure and in the recesses to form self-aligned source and drain regions adjacent to the gate structure in accordance with the present principles;

FIG. 5 is a cross-sectional view of the partially fabricated field effect transistor of FIG. 4 with a tape applied to a portion of the doped layer deposited over the gate structure and employed to exfoliate the doped layer using the two-dimensional layer as a splitting point in accordance with the present principles;

FIG. 6 is a cross-sectional view of the partially fabricated field effect transistor of FIG. 5 with the gate conductor etched to form a gap for a dielectric spacer between the vertical portions of the doped layer and the gate conductor in accordance with the present principles.

DETAILED DESCRIPTION OF PREFERRED EMBODIMENTS

Figure 7:
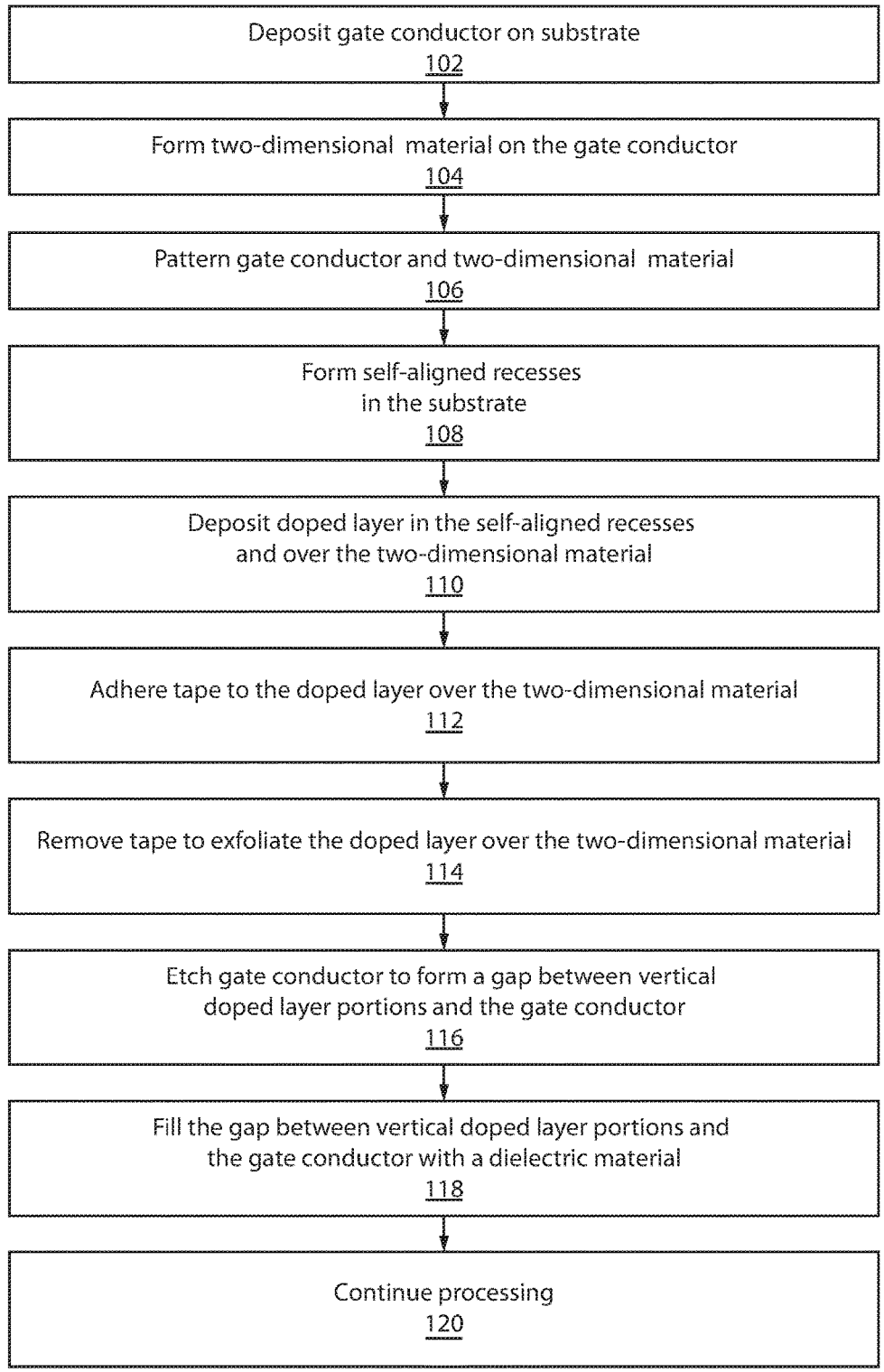
FIG. 7 is a block/flow diagram showing methods for forming a semiconductor device in accordance with illustrative embodiments.

In accordance with the present principles, structures and methods for formation are described for field effect transistors. In accordance with particularly useful embodiments, two-dimensional (2D) materials are employed in forming a gate structure. The 2D material is later employed to exfoliate a dopant rich layer used to form source and drain (S/D) regions. The dopant rich layer is formed by deposition and is employed as the S/D regions. By providing the dopant rich layer for as the S/D regions, selective epitaxial growth is eliminated from the process flow. Selective epitaxial growth provides many limitations to the process flow, and in accordance with the present principles, these limitations are avoided. With the use of a 2D exfoliation layer, the need to perform additional chemical mechanical polishing (CMP) to remove the dopant rich layer and other steps are eliminated as well.

It is to be understood that the present invention will be described in terms of a given illustrative architecture; however, other architectures, structures, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InGaAs. These compounds may include different proportions of the elements within the compound, e.g., InGaAs includes $In_xGa_{1-x}As$, where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-section of a partially fabricated field effect transistor (FET) 10 is shown in accordance with one illustrative example. The FET 10 includes a substrate 12. In one embodiment, the substrate 12 may include a III-V material, silicon material, germanium or other suitable substrate or wafer material.

The FET 10 is processed by forming a gate dielectric 14, e.g., $SiO_2$, or other dielectric material. A gate electrode layer 16 is then formed. The gate electrode 24 may include any suitable highly conductive material, e.g., Cu, Cr, Au, Ag, W, doped polysilicon, etc.

A two-dimensional material 18 is formed on the gate conductor 16. The two-dimensional (2D) material 18 includes strong bonds in two dimensions and weak bonds in a third dimension. A 2D material may include weak Van der Waals forces perpendicular to a layer (weak vertical bonding) such that the material separates easily along atomic layers or strata (e.g., strength in 2D directions). Such 2D materials can be employed as interlayers to facilitate layer transfer of subsequently grown semiconductor films.

The gate conductor 16 should be capable of offering locations for single crystalline deposition or formation of a 2D material 18 (e.g., single crystalline or single sheet (e.g., graphene) deposition). The 2D material of layer 18 may be deposited (e.g., epitaxially grown) on the gate conductor 16 or may be transferred to the gate conductor 16 by a layer transfer process. The layer 18 may include graphene or other 2D materials, such as, e.g., pantacene, $MoS_2$, $WS_2$, boron nitride, mica, dichalcogenides and complex oxides.

Referring to FIG. 2, a gate stack 24 is patterned by etching the layers 18, 16 and 14 in accordance with a mask (not shown). The mask may include a photolithographic mask or other etch mask formed and developed over the 2D layer 18. Depending on material selection, a same mask may be employed for etching all layers 18, 16, 14; however, etch chemistries may be altered. The substrate 12 is cleaned in exposed areas to provide locations for source and drain (S/D) region formation adjacent to the gate stack 24.

Referring to FIG. 3, the same mask employing in FIG. 2 may be utilized to further etch recesses 20 into the substrate 12 adjacent to the gate stack 24. Alternately, a new mask may be employed or the 2D material 18 may be employed as an etch mask to form recesses 20. Recesses 20 are formed to provide locations for forming source and drain (S/D) regions 26 (FIG. 4). The recesses 20 are self-aligned to the gate stack 24.

Referring to FIG. 4, a dopant rich layer or doped layer 22 is deposited over the gate structure 24 on the 2D material 18 and formed in the recesses 20 to form S/D regions 26. The doped layer 22 may include a semiconductor material, such as a III-V semiconductor material (e.g., InGaAs, InP, GaAs, etc.) or a IV semiconductor material (e.g., Ge, etc.). The doped semiconductor material may be single-crystalline, poly/multi-crystalline, micro/nano-crystalline, amorphous or combinations thereof.

In one embodiment, doped layer 22 includes a doped Si based material, a doped Ge based material, a doped III-V material or an alloy of these materials. The doped layer 22 may be formed using a chemical vapor deposition (CVD) process, epitaxy, sputtering, atomic layer deposition (ALD), metal organic chemical vapor deposition (MOCVD) or other process. In one particularly useful embodiment, the deposition process forms the doped layer 22 conformably so that the doped layer 22 forms on sidewalls of the gate conductor 16 and adjacent to the 2D material 18 formed on the gate conductor 16.

Doped layer 22 may include n-dopants or p-dopants as needed. The dopants may be included during the formation of layer 22 to avoid ion-implantation processes for doping S/D regions 26. In some embodiments, the dopant concentrations may be adjusted using additional processing, e.g., ion implantation, applying additional doped layers and diffusing dopants therefore into the S/D regions 26, etc.

In accordance with the present principles, the S/D/ regions 26 are self-aligned and may be formed by selecting any number of deposition processes. The present principles offer a degree of freedom for the type of deposition process selected for the formation of the S/D regions 26. By depositing the material for S/D regions 26 in the self-aligned recesses 20, selective epitaxial deposition may be avoided as well as the CMP process steps associated with post processing of the selective epitaxial growth deposition process.

With the freedom of selection of the deposition process also comes the selection of the type or phase of the material forming the S/D regions 26. For example, material for S/D regions 26 may be deposited or grown by one or more of the following processes, epitaxy, sputtering, atomic layer deposition (ALD) and metal organic chemical vapor deposition (MOCVD). ALD may form the S/D regions 26 in crystalline form. The S/D regions 26 may include a monocrystalline structure or may include a multi-crystal structure or other crystalline structure (micro, nano, etc.). However, the material of layer 22 may also include amorphous phases.

Referring to FIG. 5, a handle substrate or tape 30 is adhered to layer 22 at a top portion of the gate structures 24. The handle substrate or tape 30 adheres to a horizontal portion 23 or doped layer 22. The handle substrate or tape 30 may include any suitable material to provide leverage for exfoliating the layer 18. The handle or flexible substrate 30 may include a polymeric material(s), such as, e.g., thermoplastics, e.g., polyethylene terephthalate (PET), polyimide, etc., reinforced epoxy resins, such as e.g., prepreg boards, etc. The flexible substrate 30 may be glued or otherwise adhered by an adhesive or adhering layer to the horizontal portion 23 of layer 22 over layer 18.

Next, a lift off or removal process is performed to remove the horizontal portion 23 of layer 22 by exfoliating 2D layer 18. The handle substrate or tape 30 is stripped off of the gate structure 24. Corners 25 (FIG. 4) of the layer 22 provide locations of high mechanical stress. The corners 25 may be designed to impart a high stress to the layer 22, e.g., sharp corners, abrupt changes, etc.). When the tape 30 is removed, the adhesive pulls the horizontal portion 23 of the layer 22, the portion 23 yields at the corners 25 to permit removal of the portion 23. The bonding force between the 2D layer 18 and its adjacent layers 16 or 22 (portion 23), is weak. Therefore, the tape 30 will remove portion 23 and the entire layer 18 or a portion of layer 18. Layer 18 may be completely removed from the gate conductor 16 or may by split to divide monolayers of layer 18. Depending on the energies and the bonding, the layer 18 may be split to provide zero or more monolayers of the layer 18 on the layer 16 and zero or more monolayers of the layer 18 on the portion 23. Any material from layer 18 may be cleaned from layer 16 after the exfoliation (e.g., by etching).

In one embodiment, graphene is employed for layer 18, and the thickness of the graphene layer 18 is preferably one or more monolayers formed as a single crystal or single sheet. In useful embodiments, the number of monolayers of graphene may be determined depending on what is needed to cleanly separate the graphene to produce a split.

Once the portion 23 is removed, the remaining portions of layer 22 may be processed such that the layer 22 forms S/D regions 26. Vertical portions 28 of layer 22 may be employed as contacts for connecting the S/D regions 26 to higher level metallizations.

Referring to FIG. 6, once the portion 23 is removed from the gate conductor 16, the gate conductor 16 is etched to reduce its size between vertical portions 28. Etching the gate conductor 16 forms a trapezoidal shape to isolate the gate conductor 16 from the vertical portions 28. The etching process may include a selective etch that removes remnants of layer 18 and etches the gate conductor 16 selectively with respect to the layer 22 (S/D regions 26 and vertical portions 28). In this way, a dielectric material 32 may be deposited over the gate conductor 16 (and possible other regions) to isolate the gate conductor 16 from the vertical portions 28. Dielectric material 32 may include an oxide, nitride or any other suitable dielectric material. Processing can continue with the formation of metallizations and other structures as is known in the art.

It should be understood that the present principles have been illustratively demonstrated using a transistor structure; however, the structure and method steps may be employed with any electronic device, including diodes, lasers, passive elements (e.g., inductor, capacitors, resistors), junctions, solar cells, etc. The present principles may be employed on any devices or components that may have a deposited structure with a portion removable with a 2D material exfoliation.

Referring to FIG. 7, a method for forming a semiconductor device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a gate conductor is deposited on a substrate. The gate conductor may include a gate metal, such as, e.g., Cu, Ag, Au, Pd, Ti, W, etc. The gate conductor may include multiple layers. The substrate may include, e.g., a III-V substrate, a Si substrate, a Ge substrate, a silicon on insulator substrate, etc. The III-V materials may include, e.g., InP, InAs, AlAs, AlN, GaN, InN, AlP, GaP, InP, AlAs, GaAs, InAs, etc. or tertiary compounds, e.g., InGaAs, AlGaAs, etc.

In block 104, a two-dimensional material is formed on the gate conductor. The two-dimensional material may be formed by deposition or layer transfer. The two-dimensional material may include one or more of: e.g., graphene, pantacene, $MoS_2$, $WS_2$, boron nitride, mica, dichalcogenides, a complex oxide, etc.

In block 106, the gate conductor and the two-dimensional material are defined by patterning. The gate conductor and the two-dimensional material may be etched in accordance with a same mask, although multiple masks may be employed. Different etch chemistries may be employed to etch down to the substrate.

In block 108, self-aligned recesses are etched adjacent to the gate conductor into the substrate. In block 110, a doped layer is deposited in the recesses and over a top of the two-dimensional material. The doped layer may also be deposited along sidewalls of the gate conductor. The doped layer includes a material compatible with the substrate. The doped layer may include III-V materials, e.g., InP, InAs, AlAs, AlN, GaN, InN, AlP, GaP, InP, AlAs, GaAs, InAs, etc. or tertiary compounds, e.g., InGaAs, AlGaAs, etc., IV materials, e.g., Si, Ge, SiGe, etc.

The deposition process for forming the doped layer may be selected from any of a plurality of deposition processes. In particular, depositing the doped layer may include forming the source and drain regions by a process other than selective epitaxial growth, e.g., employing an ALD process, MOCVD, sputtering, CVD, etc.

In block 112, tape (or other substrate) is adhered to the doped layer on top of the two-dimensional material. In block 114, the tape is removed to exfoliate the doped layer from the top of the two-dimensional material to form source and drain regions in the recesses. In one embodiment, the doped layer forms corners over the sidewalls of the gate conductor adjacent to the two-dimensional material. The corners provide yield points where the doped layer breaks to exfoliate the portion of the doped layer on a top of the gate structure. In one embodiment, the doped layer may remain on the sidewalls of the gate conductor after removing the tape from the top of the two-dimensional material.

In block 116, the gate conductor is etched to form a gap between the sidewalls of the gate conductor and vertical portions of the doped layer along the sidewalls of the gate conductor. The etch may be employed to clean off any remaining two-dimensional material. In block 118, the gap (between the sidewalls of the gate conductor and vertical portions of the doped layer) is filled with a dielectric material between the sidewalls of the gate conductor and the vertical portions of the doped layer. In block 120, processing continues to complete the device. The device may include a transistor, diode, inductor, resistor, capacitor, solar cell, etc. Further processing may include forming metallizations, etc.

Having described preferred embodiments for self-aligned source and drain regions for semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    depositing a doped layer over a top of a two-dimensional material formed on a gate conductor, wherein the gate conductor is formed on a substrate;
    adhering tape to the doped layer on top of the two-dimensional material; and
    removing the tape to exfoliate the doped layer from the top of the two-dimensional material to form source and drain regions.

2. The method as recited in claim 1, further comprising forming the two-dimensional material on the gate conductor by one of a deposition process or a transfer process.

3. The method as recited in claim 1, wherein depositing the doped layer includes depositing the doped layer on sidewalls of the gate conductor.

4. The method as recited in claim 3, wherein the doped layer remains on the sidewalls of the gate conductor after removing the tape to exfoliate the doped layer from the top of the two-dimensional material.

5. The method as recited in claim 1, further comprising etching the gate conductor to form a gap between the sidewalk of the gate conductor and the vertical portions of the doped layer.

6. The method as recited in claim 5, further comprising filling the gap with a dielectric material between the sidewalk of the gate conductor and the vertical portions of the doped layer.

7. The method as recited in claim 1, wherein depositing the doped layer includes depositing the doped layer over the top of the two-dimensional material and along sidewalk of the gate conductor to form corners adjacent to the two-dimensional material, the corners providing yield points to exfoliate the doped layer.

8. The method as recited in claim 1, wherein the two-dimensional material includes one of: graphene, pantacene, $MoS_2$, $WS_2$, boron nitride, mica, dichaicogenides or a complex oxide.

9. The method as recited in claim 1, wherein depositing doped layer includes forming the source and drain regions by a process other than selective epitaxial growth.

10. A method for forming a semiconductor device, comprising:
    depositing a doped layer along sidewalls of the gate conductor and over a top of a two-dimensional material formed on the gate conductor;
    adhering tape to the doped layer on op of the two-dimensional material; and
    removing the tape to exfoliate the doped layer from the top of the two-dimensional material to form source and drain regions in recesses on opposite sides of the gate conductor.

11. The method as recited in claim 10, further comprising forming the two-dimensional material by one of a deposition process or a transfer process.

12. The method as recited in claim 10, wherein the doped layer remains on the sidewalls of the gate conductor after removing the tape to exfoliate the doped layer from the top of the two-dimensional material.

13. The method as recited in claim 10, further comprising etching the gate conductor to form a gap between the sidewalls of the gate conductor and vertical portions of the doped layer along the sidewalls of the gate conductor.

14. The method as recited in claim 13, further comprising filling the gap with a dielectric material between the sidewalls of the gate conductor and the vertical portions of the doped layer.

15. The method as recited in claim 10, wherein the doped layer forms corners over the sidewalk of the gate conductor adjacent to the two-dimensional material, the corners providing yield points to exfoliate the doped layer.

16. The method as recited in claim 10, wherein the two-dimensional material includes one of: graphene, pantacene, $MoS_2$, $WS_2$, boron nitride, mica, dichalcogenides or a complex oxide.

17. The method as recited in claim 10, wherein the recesses on opposite sides of the gate conductor are etched into the substrate partially below the gate conductor.

18. The method as recited in claim 17, further comprising forming a gate dielectric on the substrate, wherein the gate dielectric is between the gate conductor and the substrate.

19. The method as recited in claim 18, wherein the gate dielectric is between the gate conductor and the source and drain regions in the recesses on opposite sides of the conductor.

20. The method as recited in claim 18, wherein the source and drain regions are monocrystalline structures or multicrystal structures.

* * * * *